US006833627B2

(12) United States Patent
Farnworth

(10) Patent No.: US 6,833,627 B2
(45) Date of Patent: Dec. 21, 2004

(54) UNDERFILL AND ENCAPSULATION OF CARRIER SUBSTRATE-MOUNTED FLIP-CHIP COMPONENTS USING STEREOLITHOGRAPHY

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/319,064

(22) Filed: Dec. 13, 2002

(65) Prior Publication Data

US 2003/0090006 A1 May 15, 2003

Related U.S. Application Data

(62) Division of application No. 09/633,915, filed on Aug. 8, 2000, now Pat. No. 6,537,482.

(51) Int. Cl.⁷ .................. H01L 23/48; H01L 23/28; H01L 23/52; H01L 23/29; H01L 29/40
(52) U.S. Cl. .................. 257/778; 257/782; 257/792
(58) Field of Search .................. 257/778–796; 438/108–118, 124–127

(56) References Cited

U.S. PATENT DOCUMENTS

| | | | |
|---|---|---|---|
| 3,266,125 A | 8/1966 | Tobolski | |
| 4,374,080 A | 2/1983 | Schroeder | |
| 4,560,138 A | 12/1985 | DePuglia et al. | |
| 4,712,765 A | 12/1987 | Sabet | |
| 5,173,220 A | 12/1992 | Reiff et al. | |
| 5,264,061 A | 11/1993 | Juskey et al. | |
| 5,407,505 A | 4/1995 | Groenewegen et al. | |
| 5,484,314 A | 1/1996 | Farnworth | |
| 5,665,653 A | 9/1997 | Bare et al. | |
| 5,705,117 A | 1/1998 | O'Connor et al. | |
| 5,932,254 A | 8/1999 | Mitchell et al. | |
| 6,179,598 B1 | 1/2001 | Brand | |
| 6,251,488 B1 | 6/2001 | Miller et al. | |
| 6,259,962 B1 | 7/2001 | Gothait | |
| 6,261,501 B1 | 7/2001 | Miyagawa et al. | |
| 6,268,584 B1 | 7/2001 | Keicher et al. | |
| 6,325,606 B1 | 12/2001 | Brand | |
| 6,326,698 B1 * | 12/2001 | Akram .................. 257/781 |
| 6,344,162 B1 | 2/2002 | Miyajima | |
| 6,391,251 B1 | 5/2002 | Keicher et al. | |
| 6,549,821 B1 | 4/2003 | Farnworth et al. | |
| 6,607,689 B1 | 8/2003 | Farnworth | |

OTHER PUBLICATIONS

U.S. patent application Publication No. 2002/0171177 A1 to Kritchman et al., dated Nov. 21, 2002.
U.S. patent application Publication No. 2003/0151167 A1 to Kritchman et al., dated Aug. 14, 2003.
Miller et al., "Maskless Mesoscale Materials Deposition", Deposition Technology, Sep. 2001, pp. 20–22.
Miller, "New Laser–Directed Deposition Technology", Microelectronic Fabrication, Aug. 2001, p. 16.
Webpage Object Prototyping the Future, "Object FullCure700 Series", 1 page.
Webpage Object Prototyping the Future, Object Technology, "How it Works", 2 pages.
U.S. patent application Publication 2002/0195748 A1 to Farnworth, dated Dec. 26, 2002.
U.S. patent application Publication 2003/0205849 A1 to Farnworth, dated Nov. 6, 2003.

* cited by examiner

Primary Examiner—Cuong Nguyen
(74) Attorney, Agent, or Firm—TraskBritt

(57) ABSTRACT

A method for underfilling and encapsulating flip-chip configured semiconductor devices mounted on a carrier substrate using stereolithography (STL) to form, in situ, at least semisolid dam structures of photopolymeric material about the devices to entrap liquid, unpolymerized resin between the devices and substrate is disclosed. Prior to the STL process, the carrier substrate and mounted devices are immersed in the liquid polymeric resin, optionally with vibratory energy, to purge contaminants from between the device and substrate, and to fill spaces between the semiconductor devices and carrier substrate with the liquid resin.

8 Claims, 9 Drawing Sheets

UNDERFILL AND ENCAPSULATION OF CARRIER SUBSTRATE-MOUNTED FLIP-CHIP COMPONENTS USING STEREOLITHOGRAPHY

CROSS-REFERENCE TO RELATED APPLICATION

This application is a divisional of application Ser. No. 09/633,915 filed Aug. 8, 2000, now U.S. Pat. No. 6,537,482, issued Mar. 25, 2003.

BACKGROUND OF THE INVENTION

1. Field of the Invention

The present invention relates generally to stereolithography and, more specifically, to the use of stereolithography in the manufacture of electronic components. More particularly, the invention pertains to a method for sealing and protecting an interface area between a semiconductor device and a carrier substrate to which it is attached and, optionally, encapsulation of at least part of the assembly.

2. State of the Art

Flip-chip style packaging for semiconductor dice is becoming ever more popular. In a flip-chip package, an array or pattern of external conductive elements such as solder bumps or conductive or conductor-filled epoxy pillars protrude from the active surface of the semiconductor die for use in mechanically and electrically connecting the semiconductor die to like-patterned ends of conductive traces of higher level packaging such as a carrier substrate.

There is typically a large mismatch in the coefficient of thermal expansion (CTE) between the material of the semiconductor die and that of the carrier substrate, such as a circuit board or interposer, bearing the conductive traces to which the external conductive elements of the die are bonded. Thus, significant lateral stresses between the semiconductor die and carrier substrate result from normal thermal cycling. Without a strong mechanical attachment of the semiconductor die to the substrate, the die might pop loose from the carrier substrate, or one or more of the external conductive elements might fracture or release from its corresponding conductive trace. In addition, the small spacing or pitch of the external conductive elements creates a significant potential for shorting between adjacent conductive elements or conductive elements and adjacent carrier substrate traces due to the presence of a dust particle or condensed moisture between the semiconductor die and the carrier substrate. Therefore, when a flip-chip type of electronic device, such as a semiconductor die, is conductively attached to a carrier substrate, underfilling the space between the device and substrate with an electrically insulative material is very desirable to enhance the mechanical bond between the die and the substrate and to mutually laterally dielectrically isolate adjacent electrical connections between the die and the carrier substrate.

The continuing trend toward smaller semiconductor dice having smaller, more densely packed external conductive elements, and dice attached to substrates at an ever increased packing density, all exacerbate the problems already noted and further increase the desirability of using an insulating underfill.

As depicted in FIG. 1, an exemplary, conventional underfill structure 38 is formed between a flip-chip style semiconductor die 20 and a carrier substrate 10. The semiconductor die 20 has an active surface 22 with a plurality of conductive pads 32 to which external conductive elements 30 are bonded or on which external conductive elements 30 are formed, all as known in the art. In this illustration, the external conductive elements 30 comprise an array of solder balls. The semiconductor die 20 is connected electrically to the carrier substrate 10 by facing the active surface 22 to the carrier substrate face 12 and reflow-bonding the external conductive elements 30 to conductive trace pads 14 on the carrier substrate face 12.

Conventional polymeric materials used to form a dielectric underfill structure 38 are relatively viscous, many times the viscosity of water, and complete underfilling of the area between a semiconductor die 20 and a carrier substrate 10 is thus difficult to achieve. Often, these polymeric materials must be heated to an undesirably high temperature before they will flow in a satisfactory manner. The problem is especially acute where the device-substrate spacing is small. Thus, prior art methods use a vacuum source to attempt to draw the underfill material into the interstitial volume or spaces 34 surrounding the external conductive elements 30, i.e., balls, bumps, columns, etc.

As shown in FIG. 1, adequate removal of air, water vapor and condensed moisture from the interstitial volume or spaces 34, particularly the crevices 36 at connector interfaces with the active surface 22 and carrier substrate 10, is not consistently achieved. Voids or bubbles 26 of gas or condensed, liquid water may remain in the underfill structure 38 in the interstitial volume or spaces 34 and may conductively join external conductive elements 30, plurality of conductive pads 32 and conductive trace pads 14 to provide a short circuit. Moreover, the material of the underfill structure 38 does not adhere to all of the surfaces of semiconductor die 20 and carrier substrate 10 in the interconnection area under the "footprint" of the die, thus lessening the mechanical bond strength therebetween. Furthermore, the so-called Fine Ball Grid Array (FBGA) now in use in the semiconductor industry, using very small-dimensioned balls and ball pitch, as well as typically a reduced spacing between adjacent semiconductor dice on a carrier substrate and the disposition of dice on both sides of a carrier substrate, limits the use of vacuum apparatus to enhance the effective underfill between dice and the carrier substrate. As a result, the manufacture of such electronic assemblies results in high cost and a relatively high reject and rework rate, which is obviously very costly.

In the past decade, a manufacturing technique termed "stereolithography," also known as "layered manufacturing," has evolved to a degree where it is employed in many industries.

Essentially, stereolithography (STL) as conventionally practiced, involves utilizing a computer to generate a three-dimensional (3-D) mathematical simulation or model of an object to be fabricated, such generation can usually be effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a semisolid state in those areas of a given layer corresponding to portions of the object, the consolidated or fixed material also at that time being substantially concurrently bonded to a lower layer. The unconsolidated material employed to build an object may be supplied in particulate or liquid form, and the material itself may be consolidated or fixed or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer which can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by inkjet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventor's knowledge, stereolithography has yet to be applied to mass production of articles in volumes of thousands or millions, or employed to produce, augment, or enhance products including flip-chip semiconductor devices in large quantities, where minute component sizes are involved, and where extremely high resolution and a high degree of reproducibility of results is required. Furthermore, stereolithography methods have not been used to package, at the wafer level, large numbers of flip-chip dice of the same or differing configurations to provide underfilled or even packaged devices that become environmentally sealed upon bonding to a carrier substrate, such as a printed circuit board (PCB). In such a method, the difficulties of precisely locating a number of pre-existing components for stereolithographic application of material thereto without the use of mechanical alignment techniques is required to assure precise, repeatable placement of encapsulant material.

BRIEF SUMMARY OF THE INVENTION

The present invention comprises a method for underfilling semiconductor device assemblies, including semiconductor dice (either pre-encapsulated or unencapsulated) that are conductively connected to a carrier substrate. The invention further encompasses methods for both underfilling and encapsulating semiconductor devices connected to a carrier substrate. In one embodiment of these methods, a dense packing of chip scale packages (CSP) having fine ball grid arrays (FBGA) of less than 1 mm ball pitch may be provided on a carrier substrate wherein the mechanical and electrical reliability of the apparatus is much enhanced by an improved underfill structure. The method provides an underfill structure that is essentially free of voids, i.e., bubbles of air, water vapor, other vapors or gases or liquid moisture, and which securely bonds to the semiconductor device and carrier substrate. Optionally, a complete package may be formed about a semiconductor device continuously with the underfill structure and in the same process. A very tightly packed array of semiconductor devices may be formed on a substrate and completely underfilled, and optionally encapsulated as well, using a stereolithographic process.

In one embodiment, the method of the invention comprises attaching the external conductive elements of one or more semiconductor dice to conductors on a carrier substrate to form a semiconductor device assembly and tilting the semiconductor device assembly so formed to an angle of about 10 to 90 degrees from the horizontal, followed by progressively immersing the tilted semiconductor device assembly in a reservoir of liquid, photopolymerizable resin of low viscosity to drive air, moisture, etc. from spaces between the semiconductor devices and the substrate, completely filling those spaces with liquid resin. Optionally, the semiconductor device assembly or the liquid resin may be vibrated during immersion to enhance removal of voids or bubbles from the interstices surrounding the external conductive elements comprising connections between the die or dice and the carrier substrate. For example, sonic or ultrasonic vibrations may be applied to the liquid resin, to the apparatus containing the resin, or to the semiconductor device assembly while the semiconductor device assembly is submerged. The semiconductor device assembly is then leveled to the horizontal while submerged within the volume of resin and raised vertically to a position wherein a substantially uniform, thin layer of liquid photopolymer resin overlies the carrier substrate face. A computer controlled STL laser beam is then traversed over the upper surface of the carrier substrate and around the semiconductor dice mounted thereon to polymerize portions of the thin resin layer and form a semisolid or solid dam structure about each semiconductor die attached to the substrate face. As desired, the semiconductor device assembly is then lowered to provide a further thin layer of liquid photopolymer resin above the prior polymerized layer of the dam structure and a laser beam traversed again to polymerize the subsequently formed liquid layer atop the previously formed photopolymerized layer and to bond the new solid or semisolid layer to that previously formed, thus increasing the height of the dam structures. The layering steps may be repeated as many times as necessary or desired to reach the full height of the dam structure surrounding each semiconductor die and optionally bonded thereto to entrap a pool of unpolymerized liquid resin between each semiconductor die and the carrier substrate. If desired, additional layers may be formed to and over the back sides of the downwardly facing semiconductor dice to define encapsulating structures contiguous with the dam structures and overcovering the semiconductor dice. Preferably, but not necessarily, the dam structures, in combination with the semiconductor dice and the carrier substrate, sealingly contain the pools of unpolymerized resin between each die and the carrier substrate.

The semiconductor device assembly is then removed from the reservoir of liquid resin, unpolymerized liquid resin is drained therefrom, and any traces of liquid resin may be cleaned therefrom. The dam structures, optional encapsulating structures, and liquid resin pools contained between each semiconductor die and the carrier substrate face are then cured to a solid state, such curing optionally being facilitated by a thermal process or other curing method such as exposure to a broad beam light source.

The method of the invention produces a substantially void-free dielectric underfill structure that is substantially fully bonded to both the active surface of the semiconductor die (or its encapsulating layer if previously packaged) and to the carrier substrate face, as well as to the interposed external conductive connectors of the ball grid array (BGA). Thus, the semiconductor die-to-carrier substrate mechanical bond strength is greatly enhanced to avoid breakage or disconnection of external conductive elements, such as solder balls. Further, the opportunity for shorting between (and environmental deterioration of) external conductive elements, bond pads and substrate traces is substantially eliminated. If desired, the stereolithography process may be continued to completely encapsulate the entire semiconductor device assembly (but for any connections to any yet-higher level packaging) with an imperforate protective structure.

The use of stereolithography in the inventive method provides a very precisely configured dam structure of polymer that is at least partially cured and contains a reservoir of unpolymerized liquid polymer, which is subsequently solidified in a separate thermal or other curing step.

In an exemplary stereolithographic process usable with the present invention, a layer of liquid photopolymer is formed on the semiconductor die or carrier substrate surface (e.g., by submergence), and a focused laser beam is projected into specific locations of the polymer layer to form a layer of at least partially cured polymer. The process may be repeated as required to form a series of built-up polymer layers of controlled thickness and location. Together, the layers comprise a single dielectric structure of precisely controlled dimensions and shape.

The present invention employs computer-controlled, 3-D CAD initiated, stereolithographic techniques to apply protective structures to an electronic component assembly such as one or more semiconductor dice on a carrier substrate. A dielectric layer or layer segments of a dam structure may be formed adjacent to a single semiconductor die or other device or substantially concurrently to a large number of devices mounted on one or more carrier substrates being processed.

Precise mechanical alignment of singulated semiconductor devices or larger semiconductor substrates having multiple device locations is not required to practice the method of the present invention, which includes the use of machine vision to locate devices and features or other components thereon, or associated therewith, or features on a larger substrate for alignment and material disposition purposes. The laser beam of the STL apparatus may be aimed using fiducial marks on the substrate that are used to align the semiconductor devices before placement on the substrate, the shape of the devices, or any other fixed reference point that provides device location.

In a preferred embodiment, dam formation and encapsulation for mounted electronic devices according to the invention use precisely focused electromagnetic radiation in the form of an ultraviolet (UV) wavelength laser under control of a computer and responsive to input from a machine vision system, such as a pattern recognition system to fix or cure a low-viscosity liquid material in the form of a photopolymer in situ.

The inventive method not only resolves the problems associated with underfilling flip-chip devices bonded to a substrate, but facilitates the use of underfill structures with very small devices with fine featured and pitched ball grid arrays and dense device packing, to fabricate semiconductor device assemblies exhibiting high reliability. In addition, the present invention provides a relatively high processing speed due to the use of a laser with a high traverse rate, a low underfill material wastage or scrap percentage as almost all excess, liquid resin remains in the reservoir, and easy cleanup of any traces of liquid resin on each assembly removed from the reservoir.

BRIEF DESCRIPTION OF THE SEVERAL VIEWS OF THE DRAWINGS

Examples of the invention are illustrated in the following figures, in which the dimensions and proportions are not necessarily shown to scale, wherein.

DETAILED DESCRIPTION OF THE INVENTION

Figure 2:
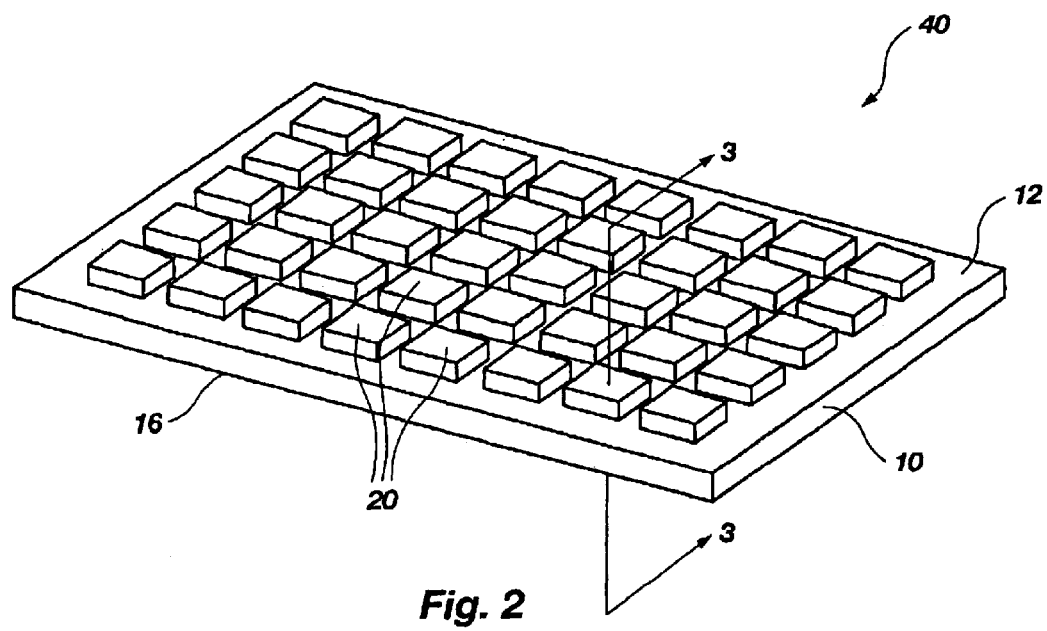
FIG. 2 is a perspective view of an exemplary electronic apparatus comprising a substrate to which flip-chip configured semiconductor devices are electrically connected, underfilled and encapsulated to the substrate face by a method of the present invention.
Figure 3:
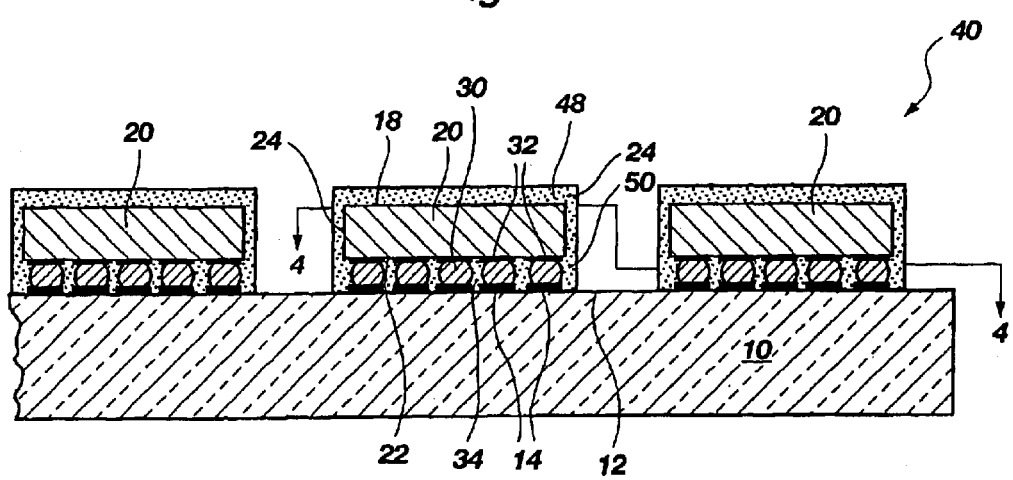
FIG. 3 is a lateral cross-sectional view of a portion of an exemplary substrate to which flip-chip configured semiconductor devices are electrically connected, underfilled and encapsulated to the substrate face by a method of the invention, as taken along line 3—3 of FIG. 2.
Figure 4:
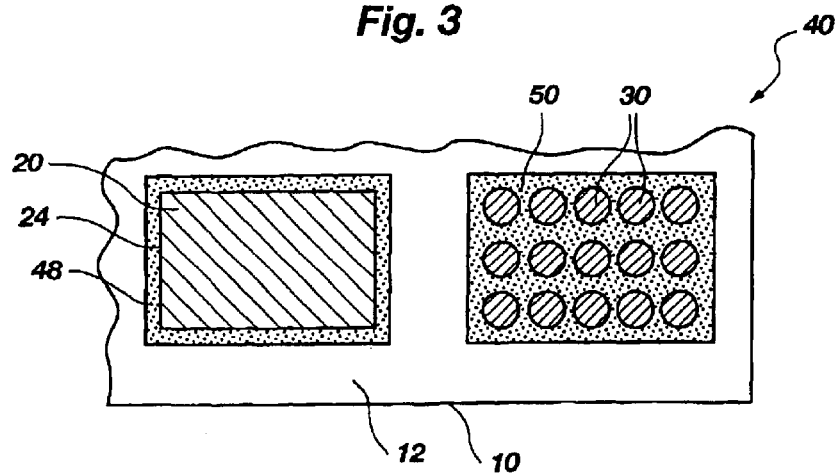
FIG. 4 is a cross-sectional plan view of a portion of an exemplary substrate to which flip-chip configured semiconductor devices are electrically connected, underfilled and encapsulated to the substrate face by a method of the invention, as taken along line 4—4 of FIG. 3.

An exemplary electronic apparatus in the form of a semiconductor device assembly 40 formed by a method of the invention is shown in FIGS. 2, 3 and 4. The semiconductor device assembly 40 comprises a carrier substrate 10 such as a circuit board, interposer or other substrate to which external conductive elements 30 such as conductive balls, bumps or columns protruding from the active surface 22 of one or more flip-chip semiconductor dice 20 are bonded through conductive trace pads 14 on the planar carrier substrate face 12. The exemplary carrier substrate 10 is shown as having a generally planar backside 16. However, the method may be applied to carrier substrates 10 and semiconductor dice 20 of any configuration, where a volume or space therebetween requires underfilling. The invention comprises a method for underfilling the area between a semiconductor die 20 mounted on a carrier substrate 10 and encompasses extension of the underfill to encapsulate the semiconductor die 20 in the same process.

In FIG. 3, exemplary semiconductor dice 20 are illustrated as having a flip-chip configuration, each bearing a ball grid array (BGA) of external conductive elements 30, such as solder balls or conductive or conductor-filled epoxy on active surface 22, and having a backside 18 and lateral sides 24. The external conductive elements 30 are shown as being bonded to the plurality of conductive pads 32 on the active surface 22 and to conductive trace pads 14 on the carrier substrate face 12. The external conductive elements 30 may be bonded to the conductive trace pads 14 by heat-induced reflow in the case of solder or by curing in the case of epoxy, using any effective method such as is known in the art.

As depicted in FIGS. 3 and 4, a support structure or underfill structure 50 formed of polymerized material essentially fills the interstitial volume or spaces 34 between each semiconductor die 20 and the carrier substrate 10, including the crevices 36 where the external conductive elements 30 meet the active surface 22 and the carrier substrate face 12. The underfill structure 50 is tightly adhered to the active surface 22 and the carrier substrate face 12 to mechanically attach the semiconductor die 20 to the carrier substrate 10. Contiguous with the underfill structure 50 is a structure or envelope 48 of protective polymer, which is shown as covering the four lateral sides 24 and backside 18 of each semiconductor die 20. The underfill structure 50, together with the envelope 48 form a polymeric protective package that seals and protects each semiconductor dice 20. Because of the unique method by which the underfill structure 50 is formed, there are essentially no bubbles of air or other gas, water vapor, or moisture within the underfill structure 50. Thus, any opportunity for mutual short-circuiting between external conductive elements 30, the plurality of conductive pads 32, and conductive trace pads 14 is virtually eliminated.

Figure 1:
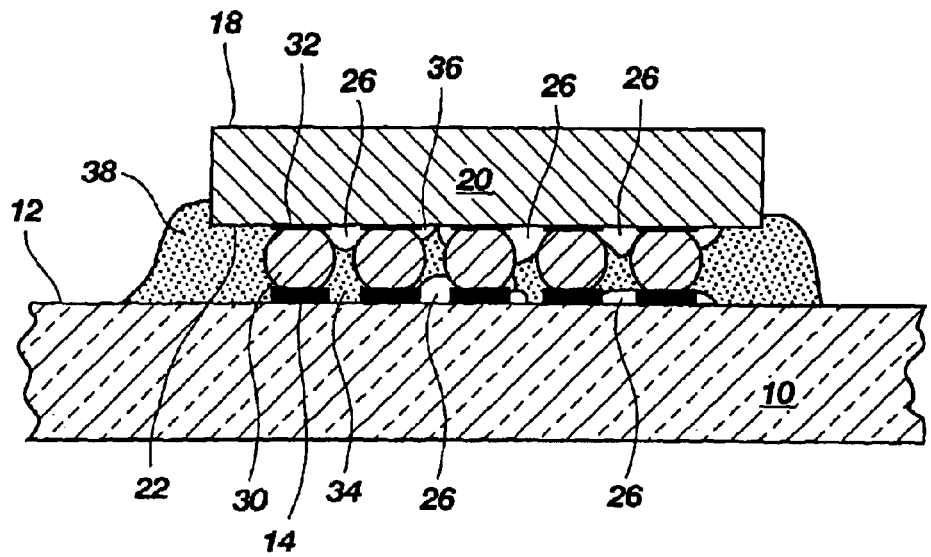
FIG. 1 is a lateral cross-sectional view of a portion of a substrate and connected flip-chip configured semiconductor device that has been underfilled in accordance with a method of the prior art.
Figure 5A:
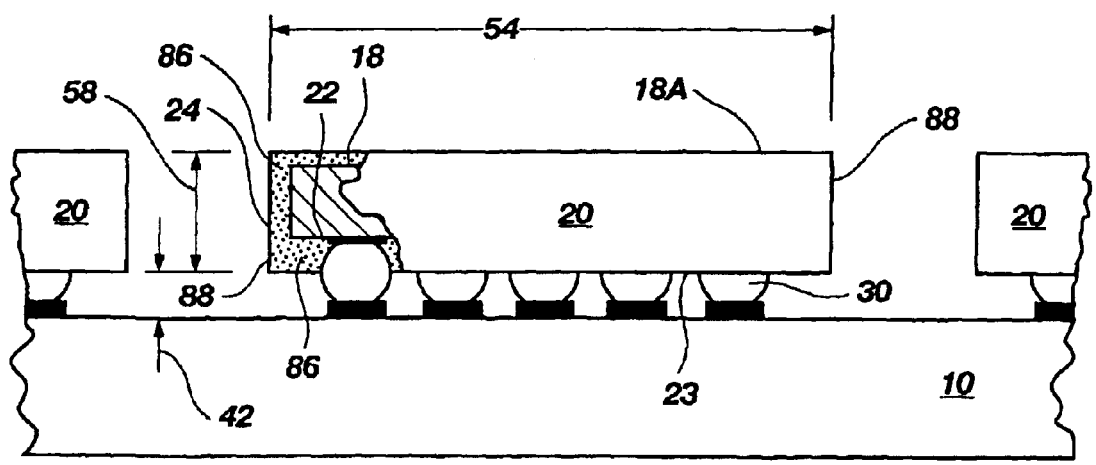
FIG. 5A is a lateral partially cutaway view of a portion of an exemplary substrate to which prepackaged, flip-chip configured semiconductor devices are electrically connected in preparation for the underfilling method of the invention.
Figure 5:
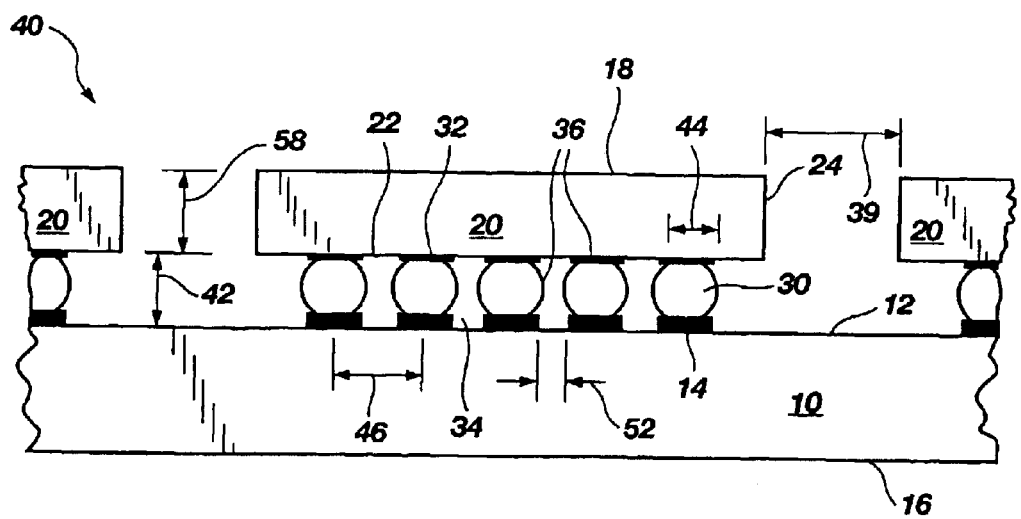
FIG. 5 is a lateral view of a portion of an exemplary substrate to which flip-chip configured semiconductor devices are electrically connected, indicating dimensions relative to practice of an underfill and encapsulation method of the invention.

FIG. 5 shows a portion of semiconductor device assembly 40 to which the invention is applied and depicts various dimensions that affect the manufacture of such apparatus. The carrier substrate 10 has a carrier substrate face 12 to which any number of semiconductor dice 20 may be attached. In this example, each flip-chip semiconductor die 20 has an active surface 22 bearing the plurality of conductive pads 32 to which solder ball external conductive elements 30 are mounted.

The term "the plurality of conductive pads" 32 is used in this application as applying to any form of conductor on the semiconductor die 20 to which an external conductive element 30, such as, for example, a solder ball or other connector, may be bonded. Also as used herein, the term "bond pad" specifically encompasses rerouted external connection pads of a die, as known in the art. The external conductive elements 30 are bonded to terminals such as conductive trace pads 14 on the carrier substrate face 12, thereby connecting the integrated circuits of semiconductor die 20 to the carrier substrate 10. In the method of the invention, the interstitial volume or spaces 34 between the semiconductor dice 20 and the carrier substrate 10 are filled with an underfill structure 50, including any crevices 36 formed by the intersection of external conductive elements 30 with surfaces 22, 12 of the semiconductor die 20 and carrier substrate 10, respectively.

It is generally desirable to minimize the lateral spacing 39 between adjacent semiconductor dice 20 on a given carrier substrate so as to enhance operational speed of the semiconductor device assembly 40 and minimize use of substrate materials, as well as minimizing overall bulk of the semiconductor device assembly 40. Thus, the current trend is toward higher and higher densities of semiconductor dice 20 on a carrier substrate 10, to enhance miniaturization and reduce overall cost. The increased market share of laptop and notebook computers and the recent, significant reductions in size and weight of the same also incentivizes the use of smaller semiconductor device assemblies. The lateral device spacing 39 may be different in different directions. As will be described below, the method of this invention facilitates the use of chip-scale packaged semiconductor dice 20 mounted at high density on a carrier substrate 10, reliably and fully underfilled and optionally fully encapsulated over the semiconductor dice backsides 18 and lateral sides 24.

The vertical or transverse device-to-substrate spacing 42 between the semiconductor die 20 and the carrier substrate 10 is determined by the size of the external conductive elements 30 (such as the diameter 44 of solder balls or the height of column or pillar-style conductive elements), type of external conductive elements 30 and other factors, such as bond pad and terminal height. In current practice, the device-to-substrate spacing 42 may be, by way of example only, any value on the order of about 1 mil to about 28 mils (about 0.025 to about 0.66 mm) and will become smaller as the industry develops external conductive elements 30 of smaller size. Furthermore, advances in making complex semiconductor devices typically require an increase in the number of external connections even as device size is being reduced. The use of smaller external conductive elements 30 and a reduced element pitch 46 results in a much more dense packing of devices, such as semiconductor dice 20 on a carrier substrate 10, with a reduced lateral spacing 52 between adjacent external conductive elements 30. In the current state of the art, so-called ball grid arrays (BGA) may use external conductive elements 30, such as solder ball elements, having a pitch 46 of greater than about 1 mm. So-called fine ball grid arrays (FBGA) use an element pitch 46 of less than about 1 mm, and the resulting device-to-substrate spacing 42 is relatively small. It is evident that such dense, external conductive element lateral packing demands special care to purge and avoid the reentry of contaminants in the connector region, and the short device-to-substrate spacing 42 makes effective underfilling more difficult.

In the figures, the external conductive elements 30 of semiconductor dice 20 are depicted as being bonded to conductive trace pads 14 on a carrier substrate face 12 of a carrier substrate 10. The semiconductor dice 20 bonded to the carrier substrate 10 may be unencapsulated dice or may be partially encapsulated or fully encapsulated, but for external conductive elements 30.

Figure 6:
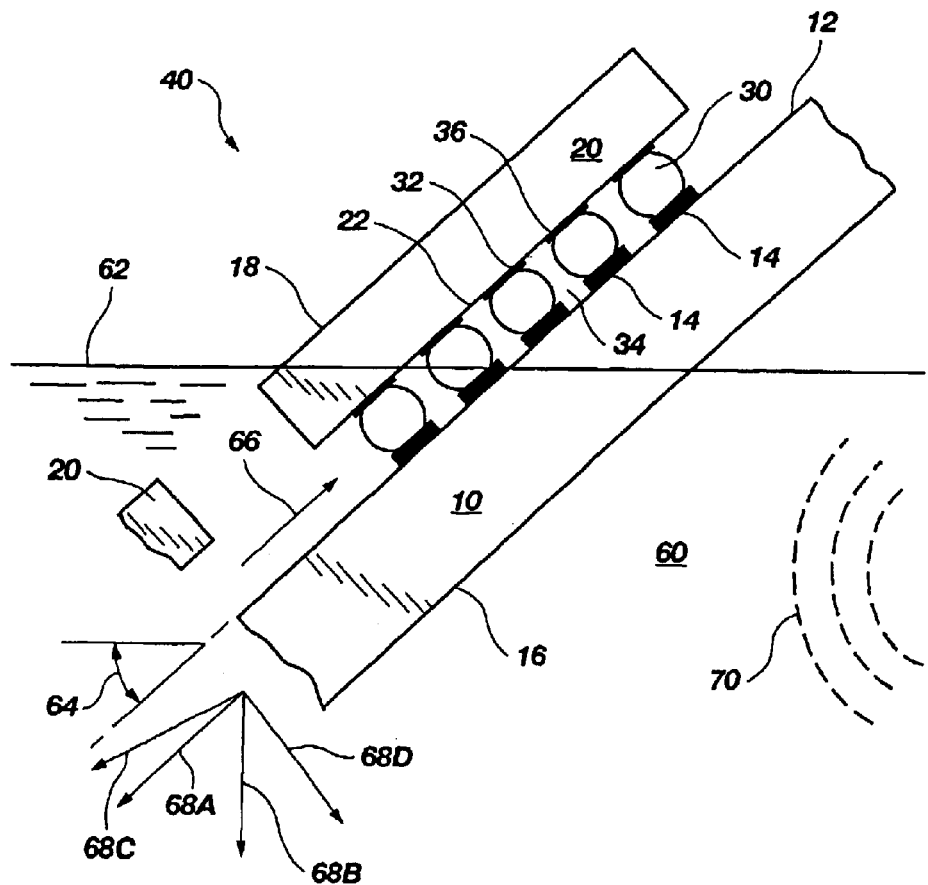
FIG. 6 is a lateral view of a portion of an exemplary substrate to which flip-chip configured semiconductor devices are electrically connected and illustrating a purging step of a method of the invention.

In FIGS. 5 and 6, a semiconductor die 20 is shown without any pre-encapsulation of the active surface 22. However, as depicted in FIG. 5A, the semiconductor die 20 may include previously applied encapsulation 86 of the active surface 22, as well as of lateral sides 24 and of the backside 18. The device thickness 58 is then defined as extending from device surface 23 to the back surface 18A of the encapsulated semiconductor die 20, and the device-to-substrate spacing 42 is the distance from device surface 23 to the carrier substrate face 12. Likewise, the horizontal dimensions 54 of a semiconductor die 20 having encapsulating material on lateral sides 24 will extend between opposing lateral sides 88 of the packaging.

According to the invention, a semiconductor device assembly 40 of a configuration described above is secured to a tiltable support such as a platform or a clamp for manipulative processing in a stereolithographic apparatus 100 (see FIGS. 7 and 8), as described below. Following the purge step described below, the same support may be used to hold the semiconductor device assembly 40 in a horizontal position during STL formation of dam structures and, optionally, die encapsulation structures.

As depicted in FIG. 6, the semiconductor device assembly 40 is tilted so that the carrier substrate face 12 is oriented at an angle 64 with the horizontal of between about 10 and about 90 degrees. Preferably for most applications, the tilt angle 64 may lie between about 30 degrees and about 60 degrees with the horizontal.

The semiconductor device assembly 40 is then subjected to a contaminant purge step, wherein semiconductor device assembly 40 and the support platform to which it is attached are progressively immersed in a liquid photopolymer resin 60. The semiconductor device assembly 40 is manipulated such that the upper liquid surface level or air-liquid interface 62 of liquid photopolymer resin 60 rises relative to the semiconductor device assembly 40 by, for example, lowering the semiconductor device assembly 40 into the resin 60, or by elevating the liquid level 62 to submerge the stationary semiconductor device assembly 40 by pumping more resin 60 into the reservoir. The rate of immersion may be between about one-quarter (0.25) inch per second and about six (6) inches per second, or even somewhat higher, with the lower rate being more effective in purging. However, the purging step should be accomplished without the formation of gross turbulence of the liquid resin 60 so as to avoid introduction of air bubbles into the resin 60 and trapping of such bubbles in semiconductor device assembly 40. As semiconductor device assembly 40 is immersed, liquid resin 60 passes upwardly in direction 66 between the semiconductor die 20 and carrier substrate 10, displacing and effectively purging gases, water vapor and moisture from the interstitial volume or spaces 34 and crevices 36 thereof. Displacement of any moisture condensed on surfaces of components of the semiconductor device assembly 40 including those in the interstitial volume or spaces 34 and crevices 36 will be effected by fluid movement of photopolymer resin 60 over these surfaces and shearing the water therefrom. If desired, the semiconductor device assembly 40 may be subjected to a dessication step using a low temperature oven or a flow of dry air or nitrogen before immersion in the liquid resin 60, to minimize the presence of moisture. In the purge step, one or more carrier substrates 10 carrying a large number of semiconductor dice 20 may be effectively purged of contaminants in a matter of seconds.

In the example provided herein, the semiconductor device assembly 40 is passed downwardly into the liquid photopolymer resin 60 in a direction 68A parallel to the carrier substrate face 12, or a direction 68B that approaches the vertical, or a direction 68C that is less than angle 64, or a direction 68D that exceeds 90 degrees from the horizontal. The preferred direction of immersion is generally parallel with the carrier substrate face 12, plus or minus about 20 degrees.

In another aspect of the invention, a vibratory force may be exerted to vibrate the semiconductor device assembly 40 relative to the liquid resin 60, or vice versa. A generally low-power vibration 70 may be applied to the liquid resin 60 by a sonic or ultrasonic generator 72 (see FIG. 7). Alternatively, and also as shown in FIG. 7, a vibration element such as a transducer 76 or 78 may be connected to the platform 120 on which semiconductor device assembly 40 is mounted, or to a movable arm 74 attached to the platform 120.

Figure 7:
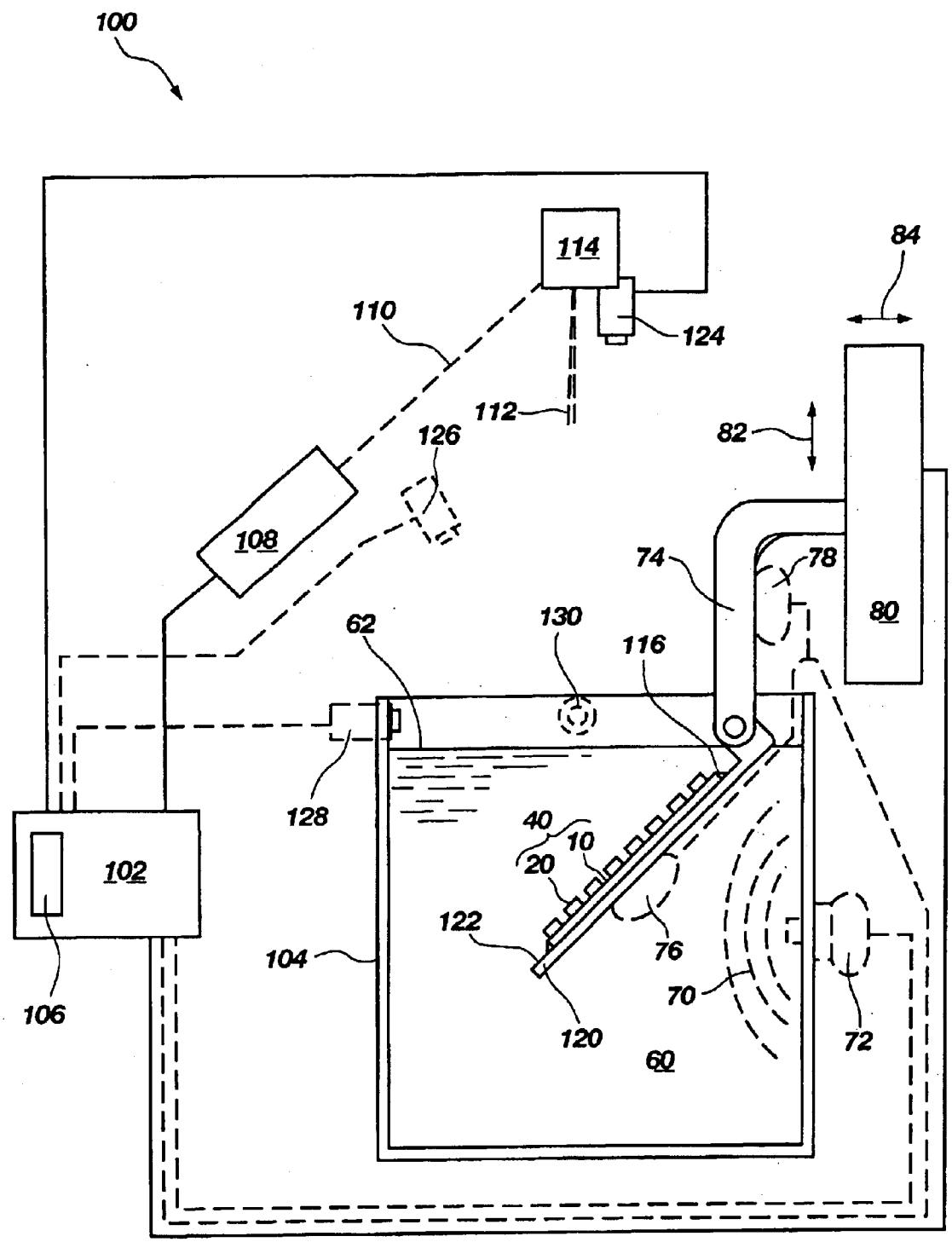
FIGS. 7 and 8 are schematic side views of a stereolithographic apparatus used in the method of the invention.

FIG. 7 schematically illustrates a stereolithographic apparatus 100 for contaminant purging, underfilling and optionally encapsulating a plurality of flip-chip semiconductor dice 20 mounted on a carrier substrate 10. The apparatus 100 is shown in a purge mode, wherein semiconductor device assembly 40 is mounted on a support surface 122 of a manipulatable support platform 120, tilted and immersed in a reservoir of liquid photopolymer resin 60. Platform 120 is supported by and manipulated in a vertical direction 82 and preferably in a horizontal direction 84 as well, by motion actuator 80 acting through arm 74. The motion actuator 80, as well as the generator 72, vibration element 76 or 78 are controlled by a program operating in computer (microprocessor) 102 and stored in memory 106.

FIG. 7 also shows other parts of the stereolithography apparatus 100 not typically used in the purge mode, such as laser 108, beam mirror 114 and camera 124, and optional cameras 126, 128 and 130. The laser 108 is not utilized during the purge mode, although, as described infra, the carrier substrate 10 of the semiconductor device assembly 40 may be mounted or secured to platform 120 by STL-formed supports on the support surface 122 prior to the purge step.

Figure 8:
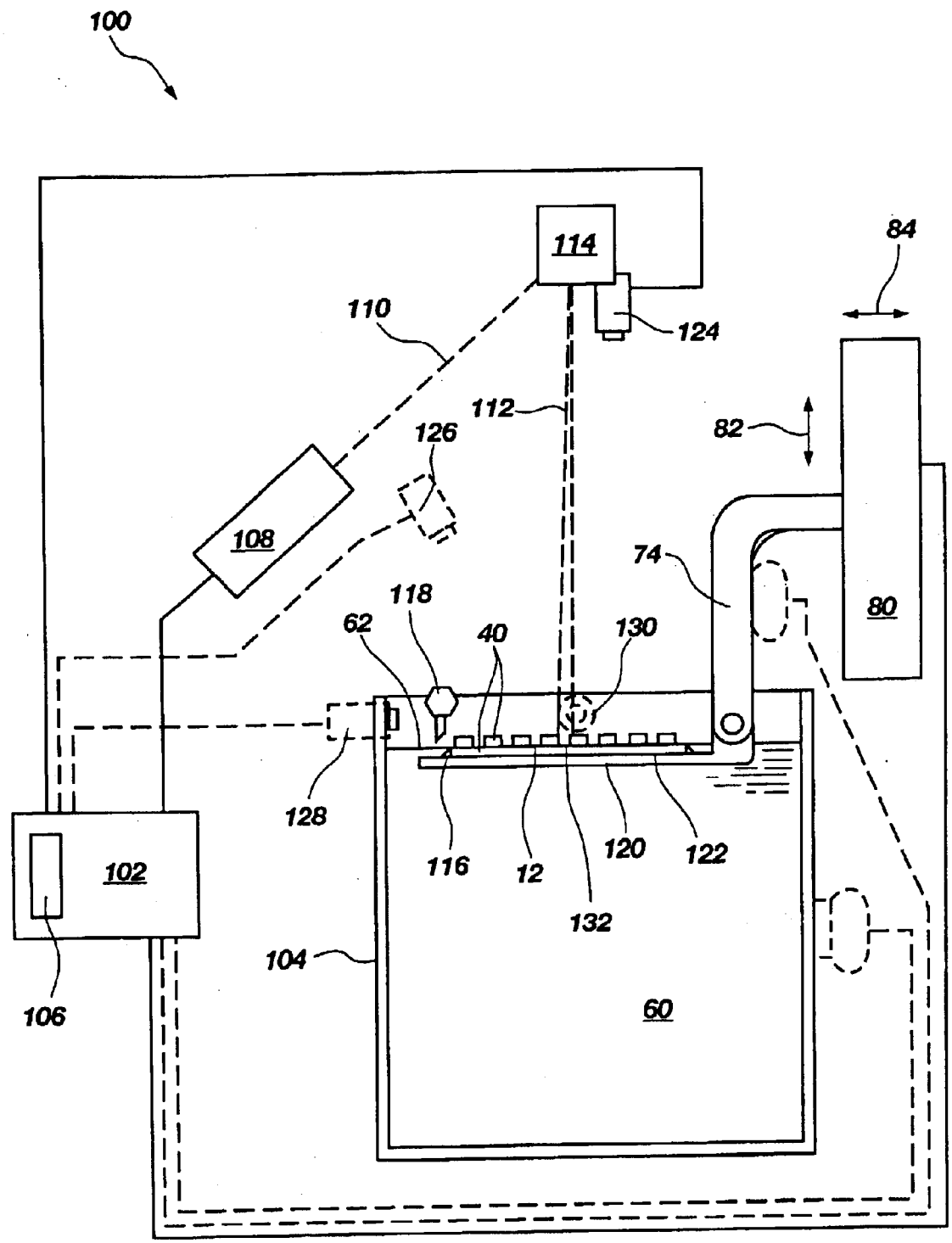

FIG. 8 depicts the stereolithography apparatus 100 as used to form an at least semisolid supportive underfill structure 50 (not shown) and optionally extend the underfill structure 50 to include a partial or complete encapsulation of each separate semiconductor die 20 (not shown) mounted on the carrier substrate 10 (not shown). The individual stereolithographic steps of an example of the method are illustrated in FIGS. 9 through 18, with reference to the apparatus shown in FIG. 8. It should be noted that in FIGS. 9 through 18, support platform 120 of the STL apparatus is not shown, but is understood that the substrate backside 16 is securely attached to the support platform 120 in a precise horizontal orientation. Thus, flooding the semiconductor device assembly 40 with liquid resin 60 during the purge step and subsequently leveling carrier substrate 10 and raising it to a depth slightly below interface 62 produces a thin liquid layer 94 of substantially uniform depth 92, e.g. 0.1–30 mils, or 0.0025–0.76 mm, over all areas upon which a structure 56 and/or envelope 48 (not shown) is to be formed.

In the invention, methods for making an underfill structure and encapsulating the flip-chip semiconductor dice 20 utilize the unique speed and precision capabilities of stereolithography, resulting in faster production, improved precision and reliability (lower rejection rate), and lower production cost.

Turning now to FIG. 8, various components and operation of an exemplary stereolithographic apparatus 100 are shown schematically to facilitate the reader's understanding of the technology employed in implementation of the present invention, although those of ordinary skill in the art will understand and appreciate that apparatus of other designs and manufacture may be employed in practicing the method of the present invention. The preferred, basic stereolithography apparatus 100 for implementation of the present invention as well as operation of such apparatus are described in great detail in United States patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,840,239; 5,854,748; 5,855,718; and 5,855,836. The disclosure of each of the foregoing patents is hereby incorporated herein by this reference. As noted in more detail below, however, a significant modification is made to conventional stereolithographic apparatus, such as those offered by 3D Systems, Inc., in the context of initiation and control of the stereolithographic disposition and fixation of materials. Specifically, the apparatus of the present invention employs a so-called "machine vision" system in combination with suitable programming of the computer controlling the stereolithographic process, to eliminate the need for accurate positioning or mechanical alignment of workpieces to which material is stereolithographically applied, and expands the use of conventional stereolithographic apparatus and methods to application of materials to large numbers of workpieces that may differ in orientation, size, thickness, and surface topography. Additional detail regarding the use of machine vision on the context of stereolithography is disclosed in U.S. patent application Ser. No. 09/259,142 filed Feb. 26, 1999 and assigned to the assignee of the present invention, the disclosure of which patent application is hereby incorporated herein by this reference.

Figure 17:
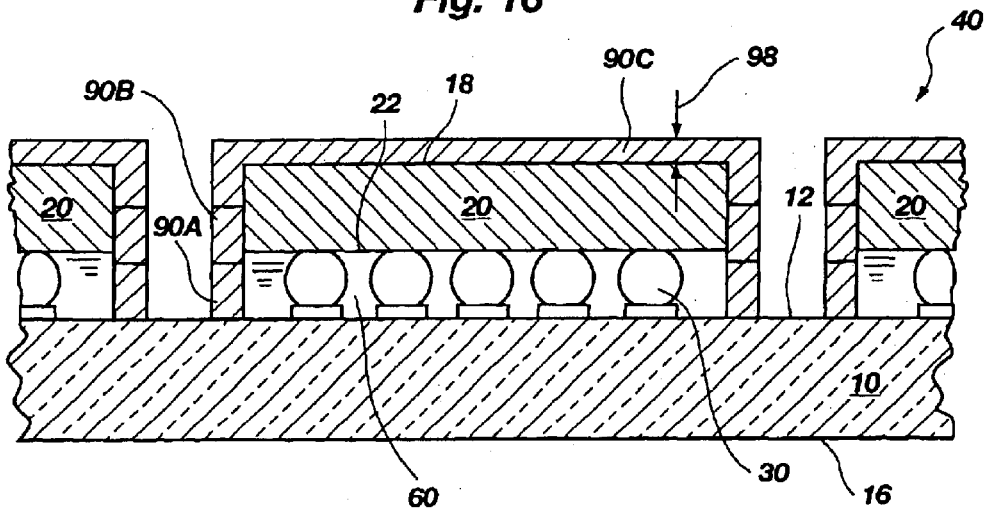
FIG. 17 is a lateral cross-sectional view of a portion of an exemplary semiconductor device assembly, showing a further step in underfill structure formation and encapsulation comprising draining unpolymerized liquid polymer from the assembly in accordance with the invention.

With reference again to FIGS. 7 and 8 and as noted above, a 3-D CAD drawing of a structure (such as a protective wall or dam and its component layers 90A, 90B, 90C, etc. see FIG. 17) to be fabricated in the form of a data file is placed in the memory 106 of a computer 102 controlling the operation of apparatus 100, if computer 102 is not a CAD computer in which the original object design is effected. In other words, an object design may be effected in a first computer, not shown, in an engineering or research facility and the data files transferred via wide or local area network, tape, disc, CD-ROM or otherwise as known in the art to computer 102 of apparatus 100 for object fabrication.

The data is preferably formatted in an STL (for StereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of an object are defined as a mesh of interconnected triangles.

Apparatus 100 also includes a reservoir 104 (which may comprise a removable reservoir interchangeable with others containing different materials) of liquid resin 60 to be employed in fabricating the intended structure. In the currently preferred embodiment the liquid resin 60 is a liquid photo-curable polymer (hereinafter "photopolymer") responsive to light in the UV wavelength range. The resin 60 may also be cured by other means, such as elevated temperature, to become a strong polymeric structure. The liquid resin 60 preferably has a viscosity at room temperature of less than about 200 times the viscosity of water, i.e., less than about 200 centipoise. In addition, when the device-to-substrate spacing 42 is significantly greater than a selected depth 92A of the first liquid layer 94A, the resin 60 should exhibit a sufficient surface tension to prevent liquid resin 60 from draining from beneath the semiconductor dice 20 to the lower liquid surface level 62. An example of this requirement is illustrated at corner 61 in FIG. 9. In general, the particular resins 60 mentioned infra work well with the normal ranges of device-to-substrate spacings noted herein.

The surface level 62 of the liquid material 60 is automatically maintained at an extremely precise, constant magnitude by devices known in the art responsive to output of level sensors, not shown, within the apparatus 100 and preferably under control of computer 102.

A support platform 120, precisely vertically movable in fine, repeatable increments responsive to control of computer 102, is located for movement in a vertical direction 82 downward into and upward out of liquid resin 60 in reservoir 104. A UV radiation range laser plus associated optics and galvanometers (collectively identified as laser 108) for controlling the scan of laser beam 10 in the X-Y plane across platform 120 has associated therewith beam mirror 114 to reflect laser beam 110 downwardly as beam 112 toward upper support surface 122 of platform 120. Beam 112 is traversed in a selected pattern in the X-Y plane, that is to say, generally in a plane parallel to platform surface 120 in a horizontal orientation, by initiation of the galvanometers under control of computer 102 to at least partially cure, by impingement thereon, selected portions of liquid material 60 disposed over platform 120 to at least a semisolid state. The use of beam mirror 114 lengthens the path of the laser beam, effectively doubling same, and provides a more vertical beam 112 than would be possible if the laser 108 itself were mounted directly above platform surface 120, thus enhancing resolution.

Data from the STL files resident in computer 102 and specifically in memory 106 is manipulated to build a structure that in this invention comprises a dam structure 56 and/or encapsulation envelope 48 (see FIGS. 3 and 13) for each semiconductor die 20, one layer or slice 90A, 90B, 90C, etc. (see FIGS. 12 through 17) at a time. An effective scanning of each layer or slice included within the structures 56, 48 of all semiconductor dice 20 of the entire semiconductor device assembly 40 is preferably effected in one continuous operation.

Accordingly, the data mathematically representing structure 56 and/or envelope 48 is divided into subsets, each subset representing a slice or layer 90 of the object. A first layer 90A is formed on the carrier substrate face 12, and a second layer 90B (if needed) is formed atop the first layer 90A. The layers are stacked atop each other until the full height of the structure 56, 48 is achieved. Each succeeding layer adheres to the previous layer to form a cohesive structure. The structure 56, 48 also adheres to the carrier substrate face 12 and to a semiconductor die 20 where suitably located.

This step-wise construction is effected by mathematically sectioning the 3-D CAD model into a plurality of horizontal layers 90A, 90B, 90C, etc., a "stack" of such layers representing the structure 56 and/or envelope 48 being fabricated. Each slice or layer may be from about 0.0001 to about 0.0300 inch thick. As mentioned previously, a thinner slice or layer 90 promotes higher resolution by enabling better reproduction of fine vertical surface features of the structure 56, 48.

In some instances a substrate support or supports 116 for nearly perfectly horizontally supporting the semiconductor device assembly 40 may also be programmed as a separate STL file, such supports 116 being fabricated before the overlying semiconductor device assembly 40 is placed thereon. The supports 116 facilitate fabrication of structure 56, 48 on semiconductor device assembly 40 with reference to a perfectly horizontal plane and removal of the structure from support surface 122 of platform 120. Where a "recoater" blade 118 (FIG. 8) is employed as described below, the interposition of substrate supports 116 precludes inadvertent contact of blade 118 with platform 120.

Before fabrication of a structure is initiated with apparatus 100, the primary STL file for the structure 56 and/or envelope 48 and the file for base substrate(s) 116 are merged. It should be recognized that, while reference has been made to a single structure or object, multiple objects may be concurrently fabricated at a level above support surface 122 of platform 120. For example, in this invention, a large number of flip-chip semiconductor dice 20 may be mounted on a carrier substrate 10, which is in turn mounted on support platform 120. The semiconductor dice 20 may have differing configurations (e.g., length, width and height) requiring differing STL file input. In such an instance, the STL files for the various differing structures 56 and/or envelope 48 for each semiconductor die 20 and supports 116 (if any) for semiconductor device assembly 40 on platform 120, may be merged.

Operational parameters for apparatus 100 are then set, for example, to adjust the size (diameter, if circular) of the laser light beam 112 used to cure liquid resin 60 to at least a semisolid state.

Before initiation of a first layer 90A for a support 116 or structure 56 and/or envelope 48 is commenced, computer 102 automatically checks and, if necessary, adjusts by means known in the art as referenced above, the surface level 62 of liquid material 60 in reservoir 104 to maintain same at an appropriate focal length for laser beam 112. U.S. Pat. No. 5,174,931, referenced above and previously incorporated herein by reference, discloses one suitable level control system. Alternatively, the height of beam mirror 114 may be adjusted responsive to a detected surface level 62 to cause the focal point of laser beam 112 to be located precisely at the surface of liquid resin 60 at surface level 62 if surface level 62 is permitted to vary, although this approach is somewhat more complex.

Figure 9:
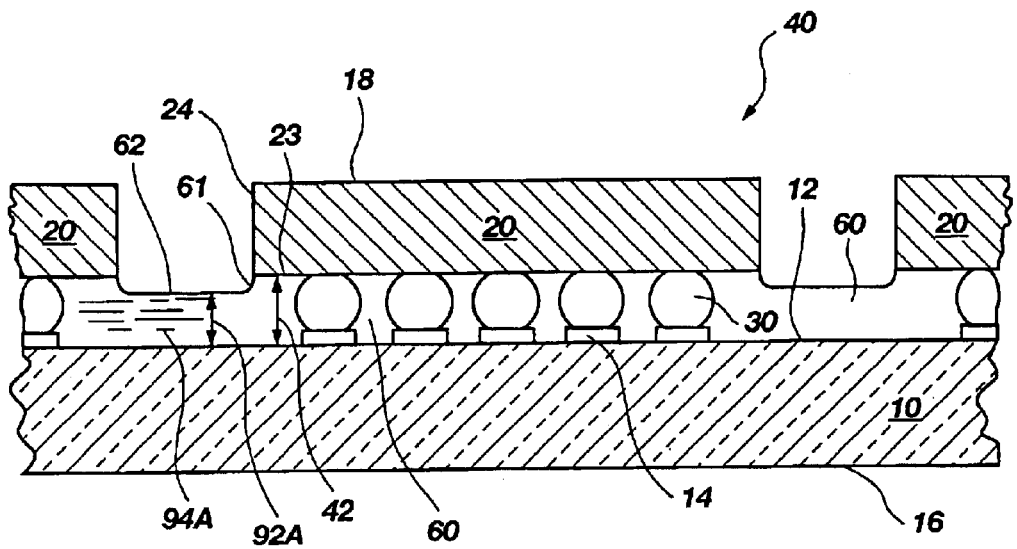
FIG. 9 is a lateral cross-sectional view of a portion of an exemplary semiconductor device assembly, showing a step in underfill structure formation comprising flooding of the assembly with a first layer of liquid photopolymer in accordance with the invention.

With reference to FIGS. 8 and 9, the platform 120 is shown as being submerged in liquid material 60 in reservoir 104 to a depth above the carrier substrate face 12 equal to the thickness of one layer or slice 90 of a dam structure 56 to be fabricated, as in FIGS. 10-15. The liquid surface level 62 is adjusted as required to accommodate liquid resin 60 displaced by submergence of platform 120 and the semiconductor device assembly 40 thereon.

Figure 10:
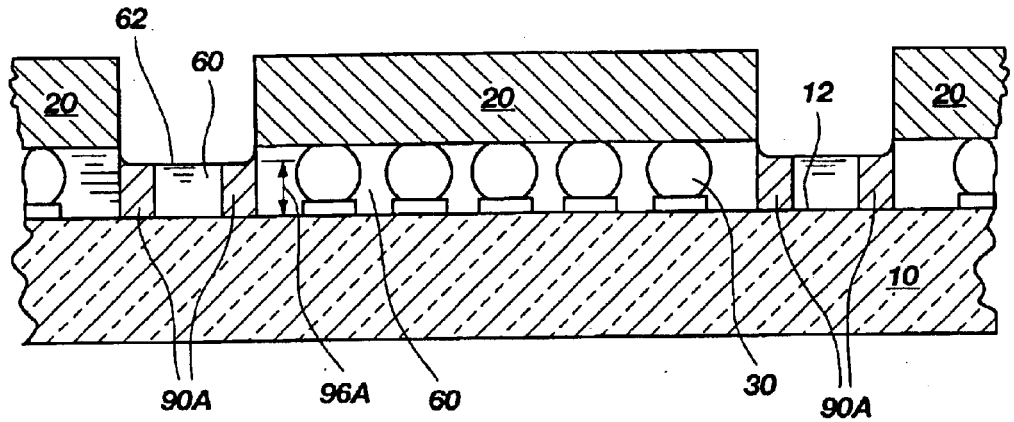
FIG. 10 is a lateral cross-sectional view of a portion of an exemplary semiconductor device assembly, showing a step in underfill structure formation comprising photopolymerization of the first layer of liquid photopolymer in accordance with the invention.
Figure 11:
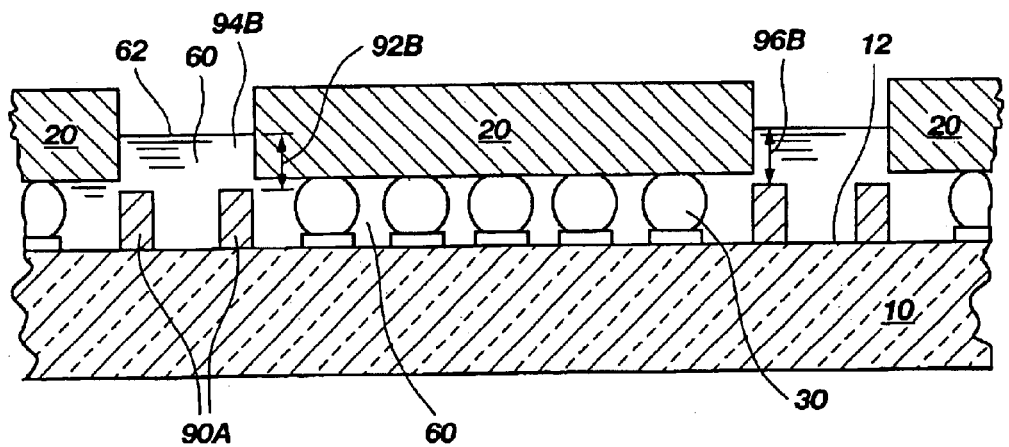
FIG. 11 is a lateral cross-sectional view of a portion of an exemplary semiconductor device assembly, showing a further step in underfill structure formation comprising flooding of the assembly with a second layer of liquid photopolymer in accordance with the invention.
Figure 12:
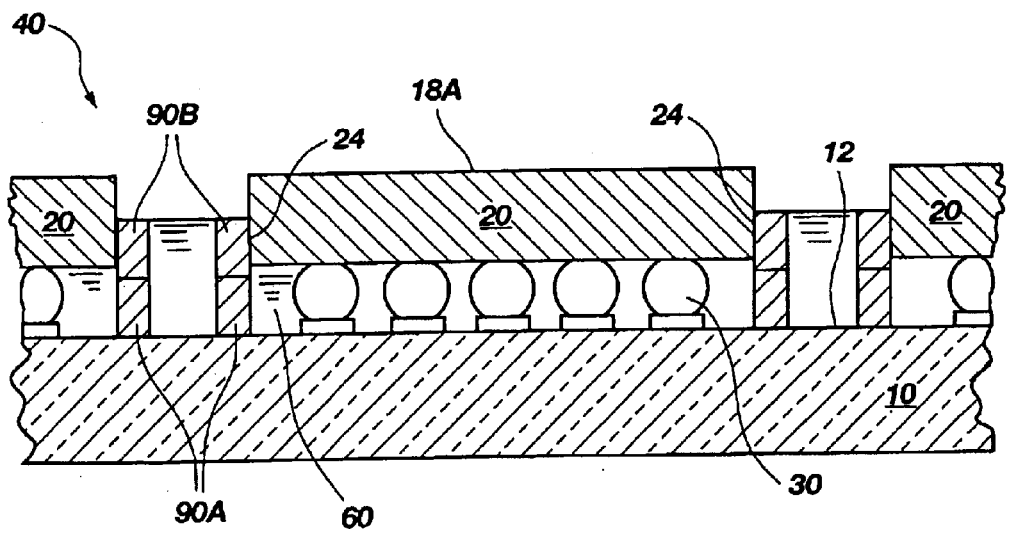
FIG. 12 is a lateral cross-sectional view of a portion of an exemplary semiconductor device assembly, showing a further step in underfill formation comprising photopolymerization of the second layer of liquid photopolymer in accordance with the invention.

FIG. 10 depicts the in situ stereolithographic formation of a first structure layer 90A on carrier substrate face 12. Laser 108 is activated so that laser beam 112 will scan liquid resin 60 over portions of the liquid surface 62 to at least partially cure (e.g., at least partially polymerize) liquid resin 60 at selected locations to an at least semisolid state. Each scanned location defines the boundaries of an at least semisolid layer 90A (of dam structure 56, not shown, for example), which is further scanned to fill in the enclosed portions of the layer. The first layer 90A has a height 96A, which is equivalent to the depth 92A (FIG. 9) of liquid layer 94A (FIG. 9) from which the layer 90A was formed.

Where the structure 56 and/or envelope 48 is to be formed from more than one polymerized layer 90 of resin 60, the process outlined above is repeated at a higher elevation. As shown in FIG. 11, platform 120 (FIG. 8) is lowered by a depth 92B of liquid layer 94B equal to the height 96B of a second layer 90B, and the laser beam 112 scanned again to define and fill in the second layer 90B (FIG. 12), while simultaneously bonding the second layer to the first layer 90A.

Any number of layers 90 may be formed to attain the desired dam structure 56 that joins the carrier substrate face 12 to all lateral sides 24 of the semiconductor die 20, depending on the device-to-substrate spacing 42, the layer thickness, the particular liquid resin 60 which is used, etc. Thus, the process may be further repeated to form additional layers 90 of the structure 56. Any structure formed by this method may constitute a single layer 90 or a plurality of layers.

The thickness or height 96 of each structural layer 90 may be varied, particularly where the required precision in layer dimension varies from layer to layer. The depth 92 of each sequential liquid layer 94 to achieve the desired structure height is controlled by computer 102 to maintain the desired dimensions of the structure 56 and/or envelope 48.

It may be desirable to form an underfill structure 50 without completely encapsulating the lateral sides 24 or 88 and backside 18 or back surface 18A of the semiconductor die 20, particularly where a semiconductor die 20 was pre-encapsulated prior to forming an underfill structure 50 (i.e., generally prior to attachment of device to the carrier substrate 10.

Figure 13:
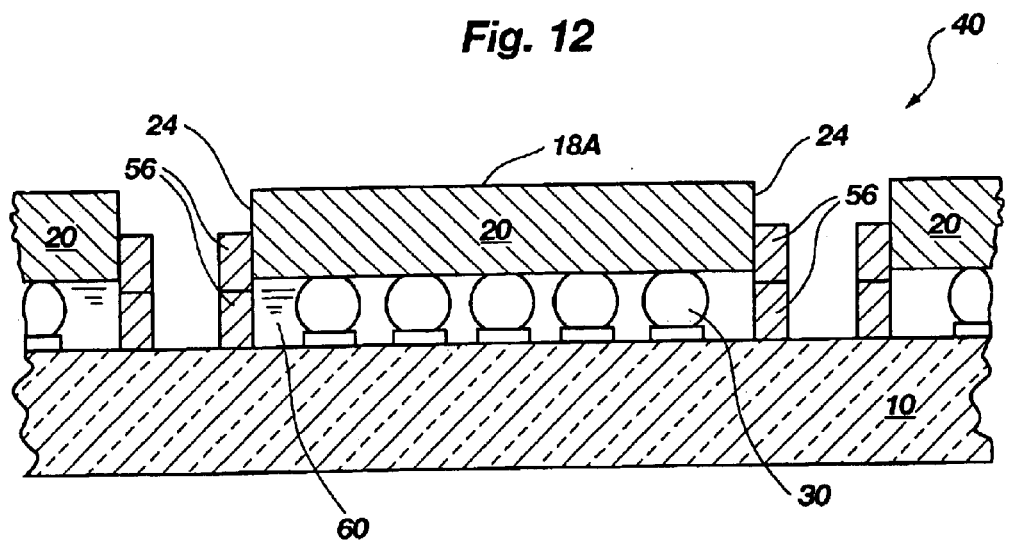
FIG. 13 is a lateral cross-sectional view of a portion of an exemplary semiconductor device assembly, showing a further step in underfill formation comprising draining unpolymerized liquid polymer from the assembly in accordance with the invention.

As shown in FIG. 13, liquid resin 60 remaining on the semiconductor device assembly 40 is then drained. However, liquid resin 60 is sealingly retained between the semiconductor die 20 and carrier substrate face 12 by dam structure 56, and completely fills the space therebetween.

Figure 14:
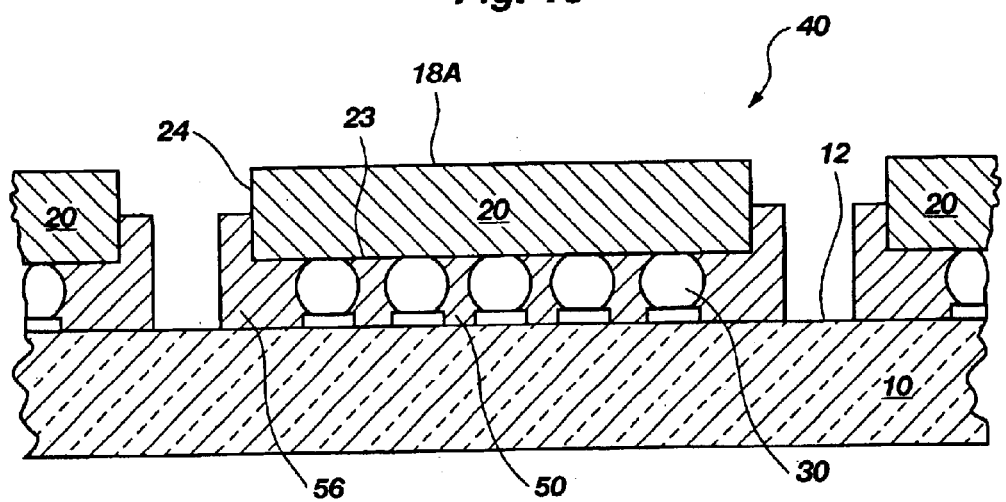
FIG. 14 is a lateral cross-sectional view of a portion of an exemplary semiconductor device assembly, showing a further step in underfill structure formation in accordance with the invention, the further step comprising a substantial cure of the photopolymerized polymer material and unpolymerized liquid resin confined between the semiconductor devices and carrier substrate by the photopolymerized material.
Figure 15:
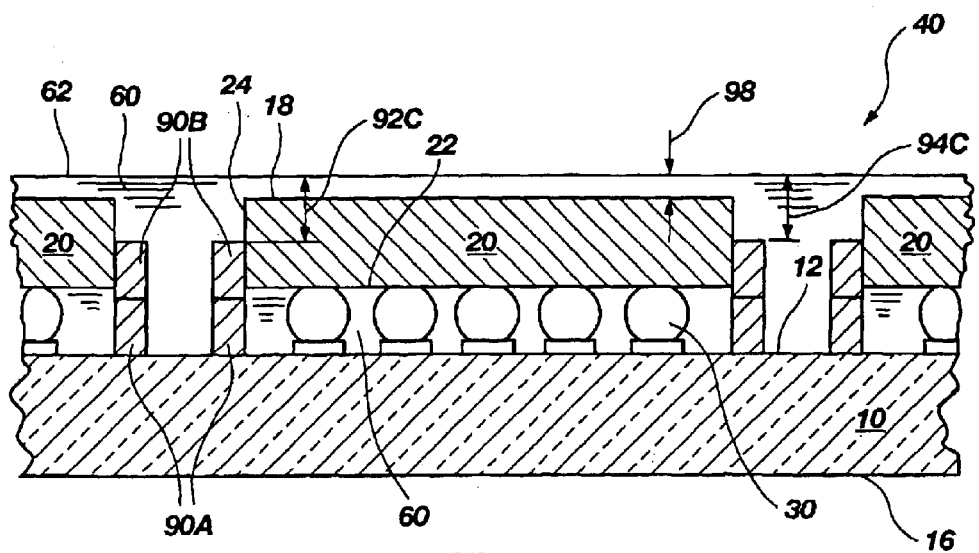
FIG. 15 is a lateral cross-sectional view of a portion of an exemplary semiconductor device assembly, showing a further step in underfill structure formation and encapsulation following the step of forming a photopolymerization of a second layer, the further step comprising flooding of the apparatus with a subsequent layer of liquid photopolymer to reach and overcover the backside of the semiconductor devices in accordance with the invention.
Figure 16:
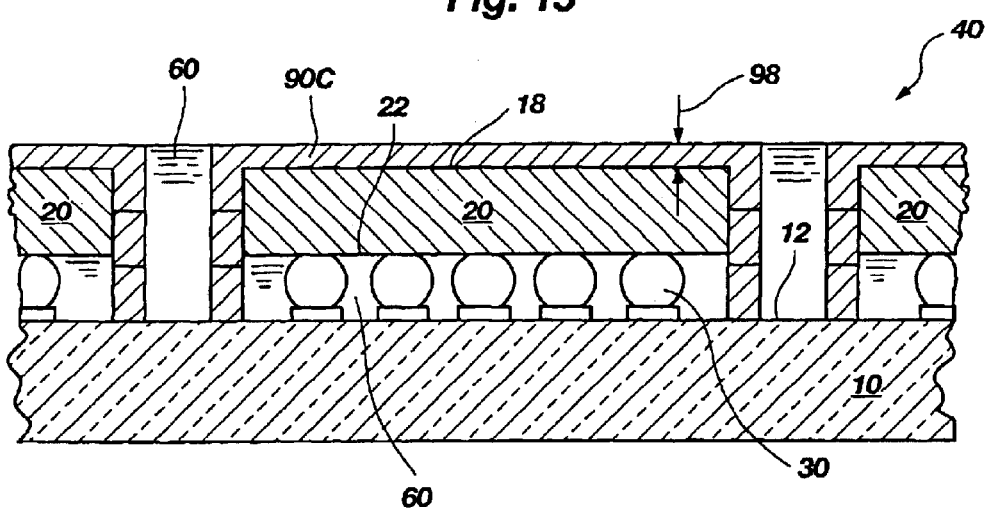
FIG. 16 is a lateral cross-sectional view of a portion of an exemplary semiconductor device assembly, showing a further step in underfill structure formation and encapsulation comprising photopolymerization of the subsequent layer of liquid photopolymer to encapsulate the lateral sides and backside of the semiconductor devices in accordance with a method of the invention.

The STL-formed structure 56 then undergoes postcuring, as the laser treated resin may be only partially polymerized and exhibit only a portion (typically 40% to 60%) of its fully cured strength. In addition, it is necessary to cure the unpolymerized liquid resin 60 trapped between the semiconductor die 20 and carrier substrate 10. Postcuring to completely harden the structure(s) 56 and/or envelope 48 may be effected in another apparatus that will cure the unexposed resin 60. Typically, the postcure will be thermal in nature and will form a singular structure from the dam structure 56 and trapped, subsequently cured resin 60. The formed structure is securely adhered to the active surface 22 or device surface 23, to portions of lateral sides 24 or 88, and to the carrier substrate face 12, as shown in FIG. 14. The underfill structure 50 is, and remains, essentially free of contaminants including air and other gases, water vapor and liquid moisture. It should be re-emphasized that the low initial viscosity of liquid resin 60 facilitates complete filling of the volume or space between each semiconductor die 20 and carrier substrate 10, encircling each external conductive element 30 and extending into any crevices 36.

Where it is desired to also fully encapsulate a semiconductor die 20, an additional polymer layer(s) 90 is formed atop the last layer so formed. The above indicated final curing step to polymerize the pool of liquid resin 60 between the semiconductor die 20 and carrier substrate 10 may be postponed until the STL-formed structure is complete.

It is assumed for illustrative purposes that in FIGS. 15 through 18, the semiconductor dice 20 are unpackaged, i.e., unencapsulated with a protective material, and that an encapsulation envelope 48 is to be formed about each semiconductor die 20. Thus, in the example of FIG. 15, the support platform 120 is lowered by a depth 92C to form a third layer 94C of liquid resin 60 atop the second layer 90B. The third layer 94C also floods the backside 18 of the semiconductor dice 20 to a desired packaging thickness depth 98.

The third liquid layer 94C is then selectively scanned by a laser beam 112, producing an at least semisolid layer 90C (FIG. 16) above second layer 90B and over the backside 18 of each semiconductor die 20, contiguous with the prior formed layers 90A, 90B.

The next step is illustrated in FIG. 17. Once the structure is completed, platform 120 is elevated above surface level 62 (FIGS. 7 & 8) of liquid resin 60, and the platform 120 with the semiconductor device assembly 40 attached thereto may be removed from apparatus 100. Excess, uncured liquid resin 60 on the surface of the semiconductor device assembly 40 may be manually drained, followed by solvent cleaning and removal from laser beam 110, usually by cutting it free of substrate supports 116, if used.

Figure 18:
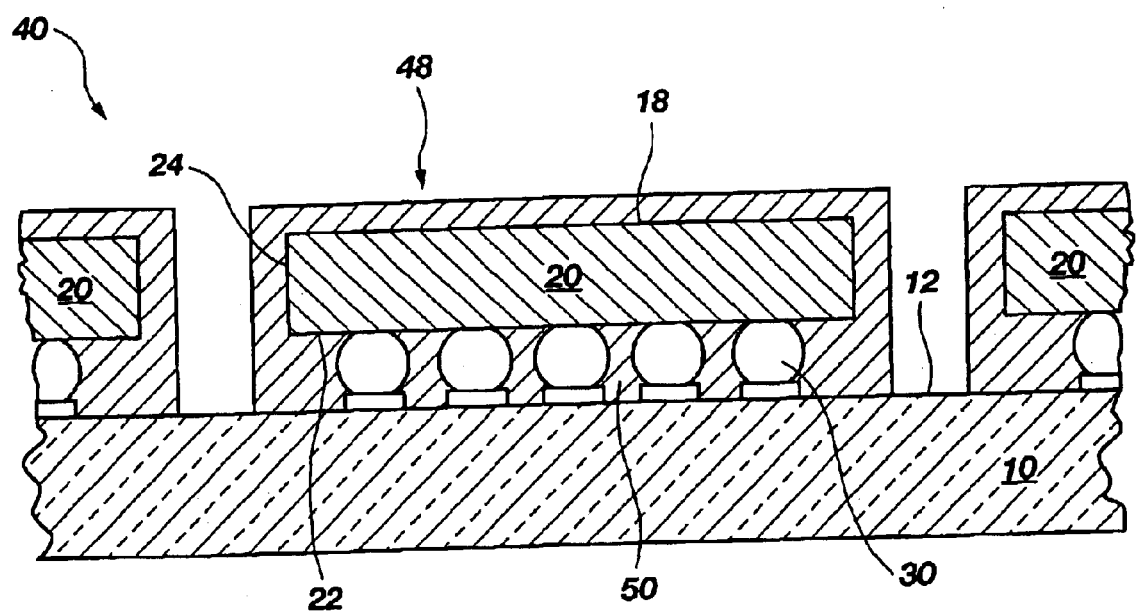
FIG. 18 is a lateral cross-sectional view of a portion of an exemplary semiconductor device assembly, showing a further step in underfill formation and encapsulation in accordance with the invention, the further step comprising a substantial cure of the photopolymerized polymer material encapsulating the semiconductor devices of the assembly and unpolymerized liquid resin confined between the semiconductor devices and carrier substrate by the photopolymerized material.

As depicted in FIG. 18, the semiconductor device assembly 40 is subjected to a final cure such as is known in the art. For example, the semiconductor device assembly 40 may be placed in an oven maintained at an elevated temperature to accelerate the cure of the partially polymerized layers 90A, 90B, and 90C (FIG. 17), and the unpolymerized liquid resin 60 (FIG. 17) trapped between the active surfaces 22 of semiconductor dice 20 and the carrier substrate face 12. A completed exemplary semiconductor device assembly 40 will be as shown in FIG. 18.

It should be stressed that the number of layers 90 to form a desired structure according to the invention may be any number. For example, for a very miniaturized, thin semiconductor die 20 connected to a carrier substrate 10 with small diameter ball external conductive elements 30, a single layer of resin 60 may be sufficient, so that one pass of the laser beam 112 may form a dam structure 56 as well as fully encapsulate the device in an envelope 48.

Sufficient liquid surface area and depth may be provided in the reservoir 104 so that more than one semiconductor device assembly 40 (each having a plurality of semiconductor dice 20 mounted thereon) may be subjected to the purge step and stereolithography process steps at the same time.

If a recoater blade 118 (FIG. 8) is employed, for example, as in forming protective encapsulation envelope 48 on the backside 18 of semiconductor dice 20 in a single layer, the process sequence is somewhat different. In this instance, the support surface 122 of platform 120, with attached semiconductor device assemblies 40, is lowered into liquid resin 60 below surface level 62, then raised thereabove until the backsides 18 of semiconductor dice 20 are precisely one layer's thickness below recoater blade 118. Blade 118 then sweeps horizontally over backsides 18, or (to save time) at least over a portion(s) thereof on which the protective envelope structure 48 is to be built. The recoater blade 118 removes excess liquid material 60 and leaves a film thereof of the precise desired depth 92 above backsides 18. Platform 120 is then lowered so that the surface of the film and liquid surface level 62 are coplanar and the surface of the liquid resin 60 is undisturbed. Laser 108 is then initiated to scan with laser beam 112 and define a first layer 90A, which in this case, provides both dam structure 56 and encapsulation envelope 48. A more detailed discussion of this sequence and apparatus for performing same is disclosed in U.S. Pat. No. 5,174,931, previously incorporated herein by reference.

As an alternative to the above approach to preparing a layer 90 of liquid resin 60 for scanning with laser beam 112, a layer 94 of liquid material 60 may be formed above a carrier substrate face 12, device backside 18, or a previously formed layer by lowering platform 120 to flood liquid resin 60 over the carrier substrate face 12, backside 18 or the highest completed layer 90 of the structure 56 and/or envelope 48 being fabricated, then raising platform 120 and horizontally traversing a so-called "meniscus blade" across the platform 120 or formed portion of the structure 56 and/or envelope 48 one layer thickness thereabove. A laser 108 is then initiated and beam 112 is scanned to define any next higher layer 90.

A yet another alternative to layer preparation of liquid resin 60 is to merely lower platform 120 vertically to a depth equal to a layer 94 of liquid resin 60 over the previously formed layer, and then traverse a combination flood bar and meniscus bar assembly horizontally over the structure being formed to substantially concurrently flood liquid resin 60 over the structure 56 and/or envelope 48 and define a precise layer depth 92 of liquid resin 60 for scanning.

All of the foregoing approaches to liquid resin flooding and layer definition and apparatus for initiation thereof are known in the art and are not material to the practice of the present invention, so no further details relating thereto will be provided herein.

In this invention, each layer 90 of dam structure 56 and/or envelope 48 is preferably built by first defining any internal and external object boundaries of that layer 90 with laser beam 112, then hatching solid areas of the structure 56 and/or envelope 48 with the laser beam 112. If a particular part of a particular layer 90 is to form a boundary of a void in the structure 56 and/or envelope 48 above or below that layer, then the laser beam 112 is scanned in a series of closely spaced, parallel vectors so as to develop a continuous surface, or skin, with improved strength and resolution. The time it takes to form each layer 90 depends upon its geometry, surface tension and viscosity of resin 60, and thickness of the layer 90.

In practicing the present invention, a commercially available stereolithography apparatus operating generally in the manner as that described above with respect to apparatus 100 of FIG. 8 is preferably employed, but with further additions and modifications as hereinafter described for practicing the method of the present invention. For example and not by way of limitation, the SLA-250/50HR, SLA-5000 and SLA-7000 stereolithography systems, each offered by 3D Systems, Inc. of Valencia, Calif., are suitable for modification.

Photopolymers believed to be suitable for use in practicing the present invention include Cibatool SL 5170 and SL 5210 resins for the SLA-250/50HR system, Cibatool SL 5530 resin for the SLA-5000 and Cibatool SL 7510 for the SLA-7000 system. All of these resins are available from Ciba Specialty Chemicals Corporation. By way of example and not limitation, the layer thickness of resin 60, for purposes of the invention, may be on the order of about 0.001 to 0.020 inch (about 0.0025 to 0.051 cm), with a high degree of uniformity over, for example, a field on a support surface 122 of a platform 120.

The size of the laser beam "spot" 132 shown in FIG. 8 as impinging on the surface of liquid resin 60 to cure same may be on the order of about 0.002 inch to about 0.008 inch (about 0.0051 to about 0.0204 cm). Resolution is preferably ±0.0003 inch (±0.00076 cm) in the X-Y plane (parallel to support surface 122) over at least a 0.5 inch×0.25 inch (1.27 cm×0.635 cm) field from a center point, permitting a high resolution scan effectively across a 1.0 inch×0.5 inch (2.54 cm×1.27 cm) area. Of course, it is desirable to have substantially this high a resolution across the entirety of the platform support surface 122, carrier substrate face 12 or device backside 18 to be scanned by the laser 112, which area may be termed the "field of exposure," such area being substantially coextensive with the vision field of a machine vision system employed in the apparatus of the invention as explained in more detail below. The longer and more effectively vertical the path of laser beam 110/112, the greater the achievable resolution.

Referring again to FIG. 8 of the drawings, it should be noted that apparatus 100 useful in the method of the present invention includes a camera 124 (and optionally additional cameras 126, 128 and 130) which is in communication with computer 102 and preferably located, as shown, in close proximity to beam mirror 114 located above support surface 122 of platform 120. Camera 124 may be any one of a number of commercially available cameras, such as capacitive-coupled discharge (CCD) cameras available from a number of vendors. Suitable circuitry as required for adapting the output of camera 124 for use by computer 102 may be incorporated in a board installed in computer 102, which is programmed as known in the art to respond to images generated by camera 124 and processed by the associated board. Camera 124 and the associated board may together comprise a so-called "machine vision system," and specifically a "pattern recognition system" (PRS), operation of which will be described briefly below for a better understanding of the present invention.

Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

In order to facilitate practice of the present invention with apparatus 100, a data file representative of the size, configuration, thickness and surface topography of the surfaces of for example, a particular type and design of semiconductor device assembly 40 having flip-chip semiconductor dice 20 attached thereto to be underfilled and/or more completely packaged, is placed in the memory of computer 102. If underfill/packaging material in the form of the aforementioned liquid photopolymer resin 60 is to be applied only to one or more (but not all) semiconductor dice 20 of one or more semiconductor device assemblies 40 mounted on support surface 122 of platform 120, camera 124 is then activated to locate the position and orientation of each semiconductor die 20 of each semiconductor device assembly 40 to be underfilled and/or packaged by scanning the semiconductor dice 20 and comparing the features of the semiconductor dice 20 with those in the data file residing in memory, the locational and orientational data for each semiconductor die 20, including data relating to the die or package dimensions also being stored in memory. It should be noted that the data file representing the design size, shape and backside topography for the semiconductor dice 20 and of traces on carrier substrate face 12 may be used at this juncture to detect physically defective or damaged dice and damaged or defective traces extending out from under semiconductor dice 20 prior to STL underfilling and packaging and to automatically delete such semiconductor device assemblies 40 from downline processing. It should also be noted that data files for more than one type (size, thickness, configuration, surface topography) of semiconductor dice 20 may be placed in computer memory 106 and computer 102 programmed to recognize not only device locations and orientations, but which type of device is at each location so that resin 60 may be cured by laser beam 112 in the correct pattern and to the height required to define the structure 56 and/or envelope 48 being fabricated. In other words, since the backsides 18 of some semiconductor dice 20 may be higher than those of others, once the lower semiconductor dice 20 have been dammed (or encapsulated, as the case may be), the layering process of the invention is then directed only to the semiconductor dice 20 requiring a higher dam structure 56 or encapsulating envelope 48.

The liquid photopolymer resin 60 selected for use in this invention may be any polymer which exhibits appropriate polymerization properties, has a desirable dielectric constant, is of sufficient (semiconductor grade) purity, has a relatively low viscosity, has sufficient strength to withstand mishandling, and that is of sufficiently similar coefficient of thermal expansion (CTE) to that of semiconductor die 20 so that the polymer structure (i.e., package) and the semiconductor die 20 itself are not stressed during thermal cycling in testing and subsequent normal operation. In addition, depending upon the thickness of resin layers desired to be formed, the liquid photopolymer resin 60 may have a surface tension that prevents it from flowing out of a device-to-substrate spacing in the range of about 1 to about 28 mils.

It is notable that the method of the present invention, in addition to providing underfill structures free of contaminants, also has capital equipment and material cost benefits. The method is extremely frugal in its use of dielectric encapsulant resin 60, since substantially all such resin in which cure is not initiated by laser 108 remains in a liquid state in reservoir 104 for use in treating the next semiconductor device assembly(ies) 40.

In addition, the underfilling and encapsulation may be performed in the same process, and the encapsulation may be of any desired thickness, such that the semiconductor dice 20 may effectively comprise encapsulated chip-scale packages (CSP) formed in situ on a carrier substrate 10.

Again, the use of a vacuum to draw resin into the underfill space between semiconductor die 20 and carrier substrate face 12 is avoided, as is the attendant equipment, time and risk of component damage.

Further, the high precision of the STL process results in semiconductor device assemblies 40, which are of enhanced uniformity in package coverage and dimensions. Surprisingly, the package dimensional tolerances achievable through use of the present invention are more precise, e.g., three times more precise than those achievable in a transfer molding system. Moreover, the process is very rapid, resulting in enhanced underfilled and packaged semiconductor device assemblies 40 at a significantly lower cost. Post-cure of semiconductor device assemblies 40 formed according to the present invention may be fully effected and accelerated in an oven at a relatively low temperature such as, for example, 160 degrees C.

It should also be noted that the underfilling/packaging method of the present invention is conducted at substantially ambient temperature, the small laser beam spot 132 size and rapid traverse of laser beam 112 around and over the semiconductor dice 20 resulting in negligible thermal stress thereon.

While the present invention has been disclosed in terms of certain preferred methods and embodiments, those of ordinary skill in the art will recognize and appreciate that the invention is not so limited. Additions, deletions and modifications to the disclosed methods and embodiments may be effected without departing from the scope of the invention as claimed herein.

What is claimed is:

1. An intermediate assembly in a process for forming a semiconductor device assembly having at least one flip chip-configured semiconductor device mounted on a carrier substrate, said intermediate assembly comprising:
   a carrier substrate with a substantially planar upper surface;
   at least one flip chip-configured semiconductor device having an active surface facing the upper surface of the carrier substrate and having a plurality of mutually laterally spaced conductive elements projecting therefrom in contact with the carrier substrate;
   an at least semisolid polymeric dam structure extending upwardly from the upper surface and surrounding the at least one flip chip-configured semiconductor device; and
   a polymerizable liquid lying within the polymeric dam structure.

2. The intermediate assembly of claim 1, wherein the polymeric dam structure is adhered to the at least one flip chip-configured semiconductor device.

3. The intermediate assembly of claim 1, wherein the polymerizable liquid is trapped between the at least semisolid polymeric dam structure, the carrier substrate and the at least one flip chip-configured semiconductor device.

4. The intermediate assembly of claim 1, wherein the plurality of conductive elements comprise one of balls, bumps, and columns formed of one of solder, gold, copper, conductive resin, and conductor-filled resin.

5. The intermediate assembly of claim 1, wherein the carrier substrate comprises one of an interposer and a circuit board.

6. The intermediate assembly of claim 1, wherein the at least semisolid polymeric dam structure extends upwardly about the at least one flip chip-configured semiconductor device and over a backside thereof.

7. The intermediate assembly of claim 1, wherein the polymerizable liquid is a photopolymer.

8. The intermediate assembly of claim 1, wherein the at least semisolid polymeric dam structure is a photopolymer.

* * * * *

UNITED STATES PATENT AND TRADEMARK OFFICE
CERTIFICATE OF CORRECTION

| | | |
|---|---|---|
| PATENT NO. | : 6,833,627 B2 | Page 1 of 4 |
| APPLICATION NO. | : 10/319064 | |
| DATED | : December 21, 2004 | |
| INVENTOR(S) | : Warren M. Farnworth | |

It is certified that error appears in the above-identified patent and that said Letters Patent is hereby corrected as shown below:

On the title page:
In the section (56) References Cited:
U.S. PATENT DOCUMENTS,
$2^{nd}$ COLUMN, last entry,      after "6,607,689 B1  8/2003 Farnworth" insert --6,613,609 B1  9/2003 Laviron et al.--

In the drawings:
In FIG. 3,      add reference numeral --36-- and associated lead line as indicated; move lead line of right-hand side occurrence of reference numeral --24-- to extend to right-hand side of lateral periphery of semiconductor die --20-- and mirror lead line of left-hand side occurrence of reference numeral --24--

Please replace FIG. 3 with the following amended figure:

--

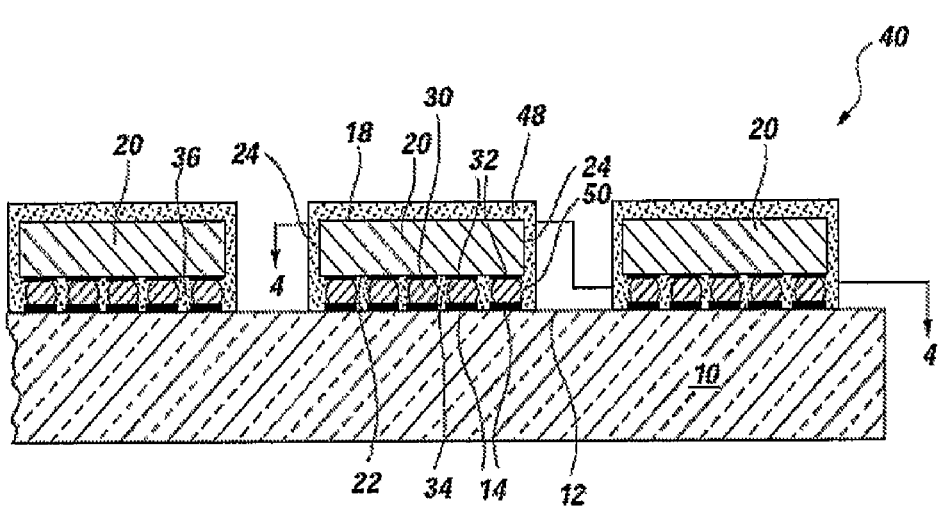

--

In FIG. 5,      delete the two existing lead lines for reference numeral --36-- and create single lead line to extend straight down into open space as indicated

UNITED STATES PATENT AND TRADEMARK OFFICE
CERTIFICATE OF CORRECTION

| | | |
|---|---|---|
| PATENT NO. | : 6,833,627 B2 | Page 2 of 4 |
| APPLICATION NO. | : 10/319064 | |
| DATED | : December 21, 2004 | |
| INVENTOR(S) | : Warren M. Farnworth | |

It is certified that error appears in the above-identified patent and that said Letters Patent is hereby corrected as shown below:

In the drawings (cont'd):
Please replace FIG. 5 with the following amended figure:

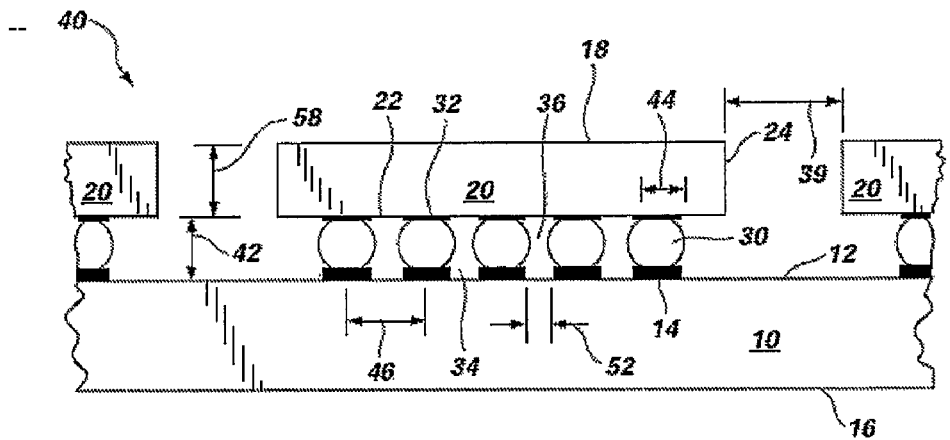

Fig. 5

In FIG. 6, change existing lead line of reference numeral --36-- to extend into open space directly opposite reference numeral --34--

UNITED STATES PATENT AND TRADEMARK OFFICE
CERTIFICATE OF CORRECTION

PATENT NO. : 6,833,627 B2 Page 3 of 4
APPLICATION NO. : 10/319064
DATED : December 21, 2004
INVENTOR(S) : Warren M. Farnworth It is certified that error appears in the above-identified patent and that said Letters Patent is hereby corrected as shown below:

In the drawings (cont'd):
Please replace FIG. 6 with the following amended figure:

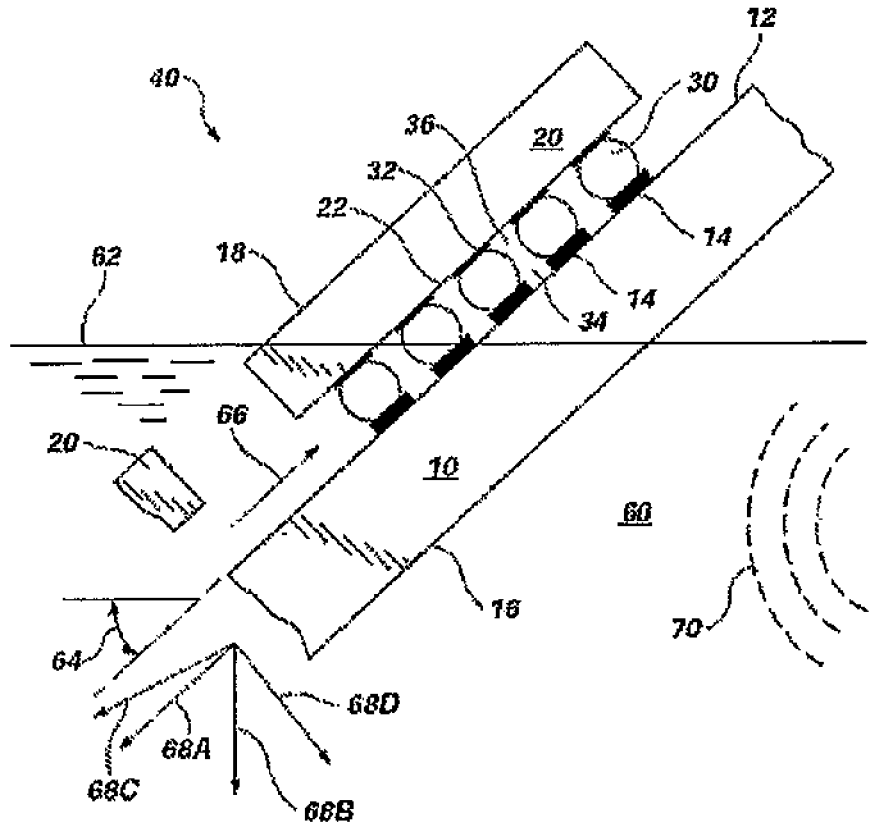

Fig. 6

In the specification:

| | | |
|---|---|---|
| COLUMN 10, | LINE 7, | change "encapsulation 86" to --encapsulation material 86-- |
| COLUMN 10, | LINE 41, | change "liquid level 62" to --air-liquid interface 62-- |
| COLUMN 11, | LINE 30, | change "arm 74." to --movable arm 74.-- |
| COLUMN 11, | LINE 59, | change "94 of substantially uniform depth 92," to --94A of substantially uniform depth 92A,-- |
| COLUMN 13, | LINE 37, | change "platform surface 120" to --platform surface 122-- |

UNITED STATES PATENT AND TRADEMARK OFFICE
CERTIFICATE OF CORRECTION

PATENT NO. : 6,833,627 B2
APPLICATION NO. : 10/319064
DATED : December 21, 2004
INVENTOR(S) : Warren M. Farnworth It is certified that error appears in the above-identified patent and that said Letters Patent is hereby corrected as shown below:

In the specification (continued):

| | | |
|---|---|---|
| COLUMN 13, | LINE 45, | change "platform surface 120" to --platform surface 122-- |
| COLUMN 13, | LINE 63, | change "structure 56, 48" to --structure 56 and/or envelope 48-- |
| COLUMN 13, | LINE 65, | change "structure 56, 48" to --structure 56 and/or envelope 48-- |
| COLUMN 14, | LINES 8-9 | change "structure 56, 48." to --structure 56 and/or envelope 48.-- |
| COLUMN 14, | LINES 15-16, | change "structure 56, 48" to --structure 56 and/or envelope 48-- |
| COLUMN 16, | LINE 66, | change "envelope structure 48" to --envelope 48-- |
| COLUMN 18, | LINE 15, | change "laser 112," to --laser beam 112,-- |

Signed and Sealed this

Twentieth Day of November, 2007

JON W. DUDAS
*Director of the United States Patent and Trademark Office*